United States Patent

[11] 3,562,504

[72] Inventor Ralph A. Harris
Houston, Tex.

[21] Appl. No. 681,352
[22] Filed Nov. 8, 1967
[45] Patented Feb. 9, 1971
[73] Assignee Texas Instruments Incorporated
Dallas, Tex.
a corporation of Delaware

[54] DIGITAL AUTOMATIC GAIN CONTROL
10 Claims, 4 Drawing Figs.

[52] U.S. Cl. 235/154, 340/347, 340/15.5
[51] Int. Cl. H03k 13/24
[50] Field of Search 235/154, 156, 194, 159, 160, 164; 340/347; 328/160

[56] References Cited

UNITED STATES PATENTS

| | | | |
|---|---|---|---|
| 2,947,478 | 8/1960 | Lentz et al. | 340/172.5X |
| 3,134,957 | 5/1964 | Foote et al. | 340/347X |
| 3,304,417 | 2/1967 | Hertz | 235/156 |

*Primary Examiner*—Maynard R. Wilbur
*Assistant Examiner*—Gary R. Edwards
*Attorneys*—Samuel M. Mims, Jr., James O. Dixon, Andrew M. Hassell, Harold Levine, Rene E. Grossman, John E. Vandigriff, Richards, Harris and Hubbard, Harold E. Meier, V. Bryan Medlock, Jr., Timothy L. Burgess and Jerry W. Mills

ABSTRACT: Digital representations of signals controlled as to amplitude in accordance with stepped gain changes are restored to the original level followed by digital automatic gain control and conversion to analogue form with gain changing at a controlled rate in direction dependent upon the difference between a given signal peak and an upper or a lower preset limit.

DIGITAL AUTOMATIC GAIN CONTROL

This invention relates to the restoration of signals stored in digital form with gain changes in steps of 2:1 and more particularly, to restoration of the signal to original levels in digital form followed by application of automatic gain control and then conversion to analogue form. In a more specific aspect, the invention relates to a digital automatic gain control system.

This invention finds utility in automatic gain control of seismic digital recordings in which either step gain changes or floating point converters are used. The problem solved is that of restoring such stepped signals to a continuous analogue signal for graphic display or application to an analogue band pass filter. Seismic exploration systems must accommodate in one way or another an extremely large dynamic range of input signal levels. It is necessary to compress this dynamic range so that all signals are at a useful level without overloading. The dynamic range of input signals is frequently in the order of 100 db. For a graphic display such as a wiggly trace record, 40 db. is about all the eye can distinguish. For good results the range should be less than 20 db.

The most commonly used method of compressing the dynamic range used in the past was the automatic gain control amplifier where the amplifier rectified and integrated its output signal. The integrated signal was used to control the amplifier gain to maintain the average output level within reasonable limits of a normalized value. Most AGC amplifiers hold the average output within about 6 db. of the normalized value for the full range of input signals.

Another commonly used method was a system of programmed gain. This method varied the amplifier gain as a function of time. Some systems used a combination of the AGC and programmed gain methods. All of these methods gave a good graphic display. Also signals recorded by magnetic recorders could be played back through analogue filters.

More recently, digital recorders have come into general use. The digital recorder samples the analogue signals at a constant rate. The analogue samples are converted to a signal representing a binary number. The binary number is recorded on the magnetic tape. In order to handle multiple channel data, a multiplexer is used. Such operations are exemplified by U.S. Pat. No. 3,134,957 to Foote et al. The mutiplexer permits multiple analogue channel data to be converted to binary numbers on a time-shared basis. The multiplexer consists of a number of switches equal to the maximum number of analogue channels to be digitized. One switch is connected to each analogue channel. The other side of each switch connects to the analog-to-digital converter. The switches close in sequence. The analogue-to-digital converter converts each analogue sample to a binary number. The binary numbers are recorded in sequence on the magnetic tape. The sequence continues through all the switches and then starts over. The operation is continuous with a constant time for completing the full sequence. This is referred to as the sample rate or interval. Most systems operate at 1, 2, 4 or 8 milliseconds. A full scan of all channels is referred to as a block of data, a frame, or a scan.

Digital recorders have higher dynamic ranges than analogue recorders. This could mean it is not necessary to compress the input dynamic range as much as with analogue recording. However, the highest accuracy and best signal-to-noise ratio is obtained when the signal is near full scale on the A-D converter. For this reason it is still very desirable to compress the dynamic range to a small value.

Most digital recordings have been made with the AGC and programmed gain control type of amplifiers. There is no problem with graphic displays or playback filtering with these recordings. Another type amplifier known as the binary gain amplifier is in use. The basic feature of this amplifier is that its gain is changed in 2 to 1 steps. Such amplifiers are actually AGC amplifiers with step gain changes. Generally, control of such amplifiers involves monitoring the word in the converter. If this exceeds an upper set point, the gain is stepped down 2 to 1. If this is less than a lower set point for a period of time set by the selected AGC speed, the gain is stepped up 2 to 1. Commonly used upper and lower set points are 50 percent and 25 percent of full scale, respectively, however, they may be set at any desired values.

A graphic display of such amplifier's output contains the step changes. It is no longer a continuous function. A seismic interpreter skilled in record interpretation can allow for the steps and still make deductions from the graphic display. However, it is not a pleasing display. If it is desired to play back the recorded signal through a band pass filter, real problems are encountered. The step change may cause ringing of the filter. The steps may not be recognizable on the graphic display because band pass filters will not pass a step function. The wave shape is altered by the filter. This may cause the interpreter to make an erroneous interpretation.

One solution to this problem is to place gain change markers on the display to mark the point at which the step occurred. However, the altered wave shape may make interpretation difficult even though it is known that a gain step occurred. Further, since a filter introduces a time delay, the gain change marker does not mark the correct time of a gain change.

During playback a digital system sends the binary number to a digital-to-analogue converter. This sets up a voltage equal to or related by a scale factor to the binary number. This voltage is applied through the multiplexer switch to a hold capacitor. The capacitor is charged to this voltage. After the multiplexer switch is opened, the capacitor holds the voltage until the multiplexer switch again closes. It then charges to the new voltage. Each such capacitor is connected to the input of a hold amplifier. The function of the hold amplifier is to present a high impedance to the capacitor so as to not discharge it appreciably. The output of the hold amplifier goes to a playback filter to remove the ripple at the sampling frequency. Thus any playback must pass through a filter. This is not as severe as passing through a band pass filter, however, it does present the problem of not passing a step function.

The only real solution to this problem is to remove the step changes. This restores the signal to the original dynamic range. Some means must then be used for compressing the dynamic range. One partial solution to the problem in use is called smoothed playback. This method removes the steps then puts them back in as a series of small steps on a function of time basis. The resulting output is then applied to an AGC amplifier.

Binary gain amplifier gains are recorded along with the signal. With gain steps of 2:1, the gain can always be expressed as a power of 2; i.e.: Gain $= K2^N$, where $K$ is a constant and $N$ is the gain word. If four binary digits are used to record $N$, it may have any value from 0 to 15: $2^0 = 1$, $2^15 = 32{,}768$. This covers a 90 db. range. Most systems record four digits for the gain. Some systems record five binary digits as a gain word. The converter word and the gain word are combined to form a floating point number. The gain word is called the exponent and the converter word is called the mantissa. The input signal is the converter word divided by the gain; i.e.:

$$E_i = \text{converter word} / K2^{-N} = 1/K\,2^{-N}\,(\text{converter word}).$$

Thus to be considered in floating point form, the gain word $N$ is used as a negative number. Two to the minus $N$ power times the converter word times a constant is the input voltage value.

The binary number system is based on powers of 2. Only two digits are available. They are 0 and 1. The position of the digit in the number determines the power of two. As an example, $XXXXXX$ is a binary number. The $X$'s represent the digits which are a 1 or a 0. The 1 or 0 is multiplied by a power of 2 to give the value of the digit. The right-hand digit is two to the zero power. It will be either 0 or 1 depending on the digit. Next to the right-hand digit represents two to the first power. It will be a 0 or 2 depending on the digit. The next digit to the left represents two to the second power. It will be a 0 or a 4 depending on the digit. Each digit to the left is one higher power of two.

Each digit has twice the value of the one on the right and one-half the value of the one on the left. The binary point has the same function in a binary number that the decimal point has in a decimal number. If *XXXXXX.XXX* represents a binary number, the first digit to the left of the point represents two to the zero power and each position to the left is one higher power of two. The first digit to the right of the point represents two to the minus one power. The next digit represents two to the minus two power. The third digit represents two to the minus three power and so forth. The values of the digits each side of point are 32, 16, 8, 4, 2, 1, POINT, ½, ¼, ⅛, 1/16. That is, any digit has twice the value of the one on the right and half the value of the one on the left. If the binary point is moved one place to the left, the number is cut in half. If moved two places to the left, the number is divided by four and so forth. Moving the point one place to the right doubles the number. Moving it two places to the right multiplies the number by 4:

*XXXXXX*=4(*XXXX.XX*), etc.

This is the meaning of the term floating point. The mantissa is a binary number. A negative exponent means moves the point to the left a number of positions equal to the exponent number. In practical applications, the shifting is accomplished by shifting the digits rather than the point. Shifting the digits one place to the right is the same as shifting the binary point one place to the left. This is accomplished by shift registers. A shift register can be made in several forms. The most common is made up of flip-flops. Each flip-flop represents one of the digits. One state of the flip-flop is defined as a one and the other as a zero. Data is entered into the register by setting each flip-flop to the proper state to represent its digit.

A right shift is accomplished by gating each flip-flop to condition the one on the right to receive its digit upon a clock pulse. Thus, at the clock pulse, each flip-flop goes to the state that the one on the left had before the clock pulse. A left shift is accomplished in the reverse manner. Examples:

| | |
|---|---|
| Right Shifts | XXXXXX. |
| 1 shift | XXXXX.X |
| 2 shifts | XXXX.XX |
| 3 shifts | XXX.XXX |
| Left Shifts | XX.XXXX |
| 1 shift | XXX.XXX |
| 2 shifts | XXXX.XX |
| 3 shifts | XXXXX.X |

Some binary gain systems do not allow space on the tape for recording the gain word. Such systems generally record only the change of gain. This can be done with just one binary digit. One system records one digit at the start of a data scan to say the gain is to increase in that scan. If the gain is to decrease in that scan a zero is recorded for this digit. With each channel word a single digit is recorded as a 1 if the gain changed, or recorded as a 0 if the gain did not change. Another method is to record two digits along with the data word. One digit would record as 1 for a gain increase, the other for a gain decrease. They would both be a 0 if the gain were not changed.

Another known digital system is the floating point system. This system has no gain control as such. Each channel as it is sampled determines the proper exponent and mantissa for that level of input signal. This type system will not produce a usable graphic display at all. The proper exponent is determined at each sample. The exponent will change several times during one cycle of a low frequency signal. The waveform is thus badly chopped up.

A floating point system may shift the point one place at a time. This will make 2 to 1 step changes in the output. In this case four digits can represent a range of 90 db. as in the case of the binary gain amplifier. The point may be shifted two positions at a time. This makes 4 to 1 step changes. Three binary digits can represent a range of 84 db.

One known system shifts the point three positions at a time. This makes 8 to 1 step changes.

The present invention provides for restoring the waveform of any step gain change system to a conventional AGC-type waveform. It may be employed while the recording is being made to form a graphic display. It may also be employed during playback to provide a signal that can be filtered and make a graphic display.

In accordance with the present invention, the signal is restored to original levels and an AGC operation is performed in digital form before conversion to analogue data. This permits use of integrated circuits and the same hardware may serve for all channels rather than having separate hardware for each channel. Memories serve to store the results on an individual channel basis permitting the AGC action to be on an individual channel basis.

In accordance with the invention, an AGC system is provided for use in restoration of seismic signals of digital form having gain changes stepped in accordance with a factor $2^N$ and wherein a digitally coded gain signal is related on a time scale to the seismic signal. A shift register receives successive words of the seismic signal and a shift control means responsive to the gain signal shifts the radix point in each word in the shift register in accordance with the gain signal. A multiplying unit receives as a multiplier the shifted signal words from the register and an output register receives the output from the multiplier unit. The multiplicand for the multiplier unit is generated in response to a comparison of successive peaks in the signal and is stepped at predetermined times in steps dependent upon the differences between successive peaks. The output register is coupled to a D-A converter to produce a gain controlled analogue signal.

The method thus involves shifting each word of a seismic signal in accordance with a gain signal to eliminate said discontinuities and then multiplying each shifted word by a gain control multiplicand. The resultant product is converted to an analogue signal while each peak of the product is compared to an upper preset limit and a lower present limit to control the multiplicand which changes at a controlled rate in direction in dependence upon whether the signal exceeds an upper limit or is less than a lower limit.

For a more complete understanding of the invention and further objects and advantages thereof, reference may now be had to the following description taken in conjunction with the drawings, wherein.

Figure 1:
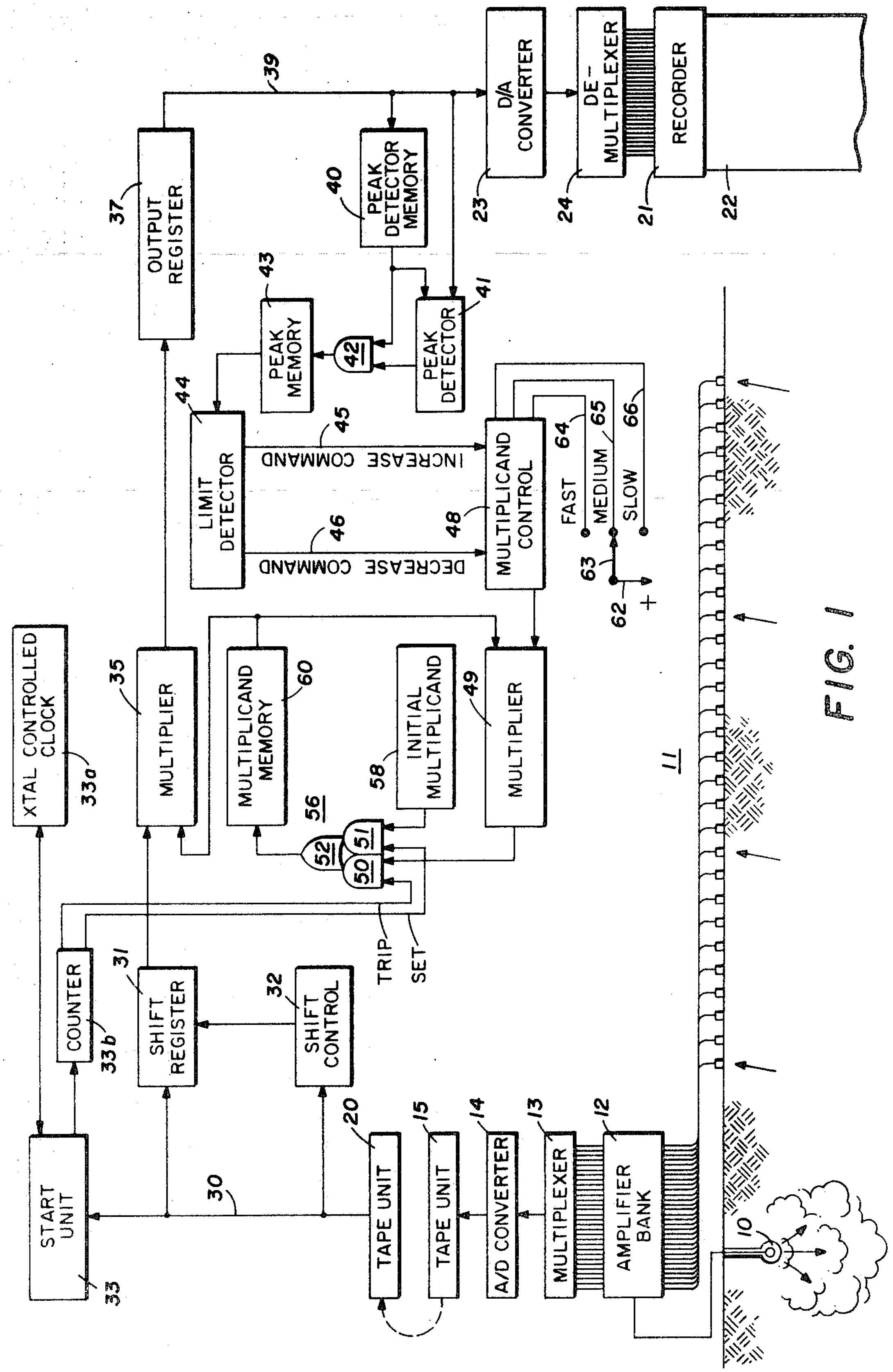
FIG. 1 represents an embodiment of the invention wherein a multidigital gain word is recorded with each signal word.

In FIG. 1 a seismic source 10 is employed to generate seismic waves which are detected in a spread of detectors 11. Individual signal channels from detector 11 are applied to a bank of amplifiers 12 whose output is applied to a multiplexing unit 13. The output of unit 13 is applied to an A-D converter 14 whose output in turn may be stored as on magnetic tape unit 15. The operation thus serves to provide a reproducible recording of signals from the detectors in spread 11.

As above described, it is known to utilize amplifiers in unit 12 having stepped gains and recording, in tape unit 15, as the mantissa of the A-D converter 14 and the gain words as the exponent.

The recording thus produced may then be processed or otherwise treated with one ultimate purpose often being to produce an output display wherein the signals are portrayed on a time scale indicative of subsurface structure or capable of being interpreted in terms of the character of the subsurface underlying the source 10 in spread 11. The tape may be applied to a playback tape unit 20 for the purposes of producing signals which would be applied to a recorder 21 to produce a seismogram 22.

In the system of FIG. 1 the digital signals from tape unit 20 are restored in amplitude in dependence upon the gain word and while in digital form are modified in amplitude in accordance with an automatic gain control function to maintain the signal in predetermined limits following which the signal is applied to a D-A converter 23 which is connected to recorder 21 by way of a demultiplexer 24.

The mantissa portion of the output of tape unit 20 is applied to a shift register 31 and the exponent or gain word to a shift control unit 32. A timing and control unit 33 is also connected to the tape unit 20. The appearance of each word on channel 30 serves to generate a start signal by start unit 33. The start signal is applied to a crystal-controlled clock 33*a* which operates in the range of one to two megacycles. In a system where there are 32 channels on tape unit 20 and multiplexer 13 samples each geophone signal at 1 millisecond intervals, a start pulse is applied to unit 33 every one thirty-second millisecond to start a sequence of operations upon each mantissa.

Shift register 31 is connected to one input of a multiplier 35, the output of multiplier 35 being connected to an output register 37. The register 37 is connected at its output to the converter 23 by way of multiline path 39. The successive words from tape unit 20 are fed serially through the register 31 where they are shifted to remove gain steps. They then are transferred via multiplier 35 and register 37 to converter 23, demultiplexer 24 and recorder 21.

Path 39 is connected to the input of peak detector memory 40 as well as to one input of a peak detector 41. The output of peak detector memory 40 is connected to a second input of peak detector 41 and to one input of an AND gate 42, the second input of the AND gate 42 being supplied by peak detector 41. The output of AND gate 42 is connected to a peak memory unit 43 whose output in turn is applied to a limit detector 44.

A first output (increase) channel of limit detector 44, the path 45, is connected to one input of a multiplicand control unit 48. A second output (decrease) path 46 is also connected to the multiplicand control unit. Multiplicand control unit 48 is connected to one input of a multiplier unit 49 which feeds one input of an AND gate 50 in a logic unit 56. The AND gate 50 has the TRIP channel leading from a counter 33*b*. A companion AND gate 51 has an input SET line leading from unit 33*b*. The second input of AND gate 51 is supplied by an initial multiplicand storage unit 58. An OR gate 52 is connected at its input to the output of AND gates 50 and 51 and has its output in turn connected to a multiplicand memory unit 60. Unit 60 may have a single multiplicand stored therein for control of the initial gain of all 32 geophone signals reproduced by tape unit 20. Alternatively, it may have a separate multiplicand stored therein for each signal. The multiplicand from unit 60 will serve to control the gain for such interval after time break or shot instant as is represented by a preset count in the counter 33*b*. Following this interval, the multiplicand in memory 60 will change automatically. More particularly the output of the multiplicand memory unit 60 is connected to the second input of multiplier unit 49 and to the second input of multiplier unit 35.

The multiplicand control unit 48 is supplied with control level voltage by way of line 62 leading to a switch 63, a three-position switch which supplies control states to unit 48 by way of one of lines 64, 65 and 66.

In FIG. 1, data in digital form goes to a shift register 31 and to a timing and control unit 33. Unit 33 provides the clocking memory address registers and all controls with clock 33*a*. The exponent or gain word enters the shift control 32. The shift control 32 decodes the gain word as to number and direction of shifts. It then actuates the shift register 31 to provide the proper shift. The data in the shift register 31 is thus restored to the original level except for the amplifier gain constant.

Since the shift register is connected to multiplier 35, the proper choice of the multiplicand, the multiplier output will be at the desired normalized level. The multiplicand is stored in the multiplicand memory 60. The input to the multiplicand memory is from gates 56. These gates determine if the multiplicand is to be a fixed initial value or an automatically determined value. Before reproduction of a given record is initiated, the SET line is manually fixed at a high voltage. This voltage controls the logic network 56 as to route the initial multiplicand from unit 58 to the multiplicand memory 60. As above indicated, the initial multiplicand is derived from manual switches in unit 58 which an operator, because of experience or knowledge of the level of signals expected from tape unit 20 may set at his will. The switches may be provided for separate actuation, one switch for each channel. Alternately they may be ganged into two or more channels per switch to reduce the number of operations an operator must perform in order to prepare for amplitude restoration, gain control, and D-A conversion before demultiplexing.

After the first arrivals and at a time determined by counter 33*b*, the SET line will go to zero and the TRIP line will go high. The SET and TRIP lines may be on an individual channel basis or ganged. After TRIP, the multiplicand is derived automatically. The multiplying unit 35 is a conventional type. It may use two shift registers and an adder to perform multiplication. The output of the multiplying unit 35 goes to output register 37. The output register supplies data to the digital-to-analogue converter 23.

The output register also supplies peak detector 41 and peak detector memory 40. The output of the memory also goes to the peak detector 41. Thus, the two inputs to the peak detector are the data word for a given sample and for a previous sample from the same signal. The memory 40 stores one word from each signal for one sample interval. The peak detector 41 compares the sample to the previous sample. If the new sample is larger, the waveform has a positive slope. The first time the new sample becomes smaller than the previous sample, the slope of the waveform has changed from positive to negative. That is, a positive peak has been passed. The previous sample will be essentially at the peak value. At this time, gating routes the previous sample to peak memory 43. Peak memory 43 stores the peak values for each of the signals. The peak values remain in storage until a new peak value is identified in a given signal and is entered in memory 43. The new sample is now smaller (more negative) than the previous sample. As long as this condition prevails, the slope of the waveform is negative. The first time the new sample is more positive than the previous sample, a negative peak has been passed and the previous sample is gated to peak memory 43. The peak detector 41 is of known type shown in FIG. 2 consisting of an adder, a complement circuit and a pulse generator. The data sample from the output register 37 connects to one of the inputs of adder 41*a*. The peak detector memory 40 supplies the previous data sample to the complement circuit 41*b*. This forms the two's or one's complement and applies it to the other adder input. Either two's complement or one's complement may be employed.

The output of the adder 41*a* is the difference between the new sample and previous sample. The adder output will reverse polarity each time a peak is passed. The sign bit of the adder is examined. Each time it changes from a 0 to a 1. or from a 1 to a 0. generator 41*c* produces a pulse. This pulse clocks the word in the peak detector memory 40 to the peak memory 43.

The peak memory 43 stores the peak value for each signal until it is replaced by the next peak value for a given signal.

Referring again to FIG. 1, the limit detector senses the word in the peak memory 43. If this exceeds an upper set point, a decrease command is delivered to the multiplicand control. The upper set point in limit detector 44 is manually selectable. The setting is selected in dependence upon the amount of signal burst-out capability desired. It will normally be set 12, 18 or 24 db. below full scale of the output register. The output register 37 preferably will have a number of bits equal to or greater than the digital-to-analogue converter used.

If the word is less than a lower set point, an increase request issues an increase command. An increase request is thus used to produce an increase command to the multiplicand control 48. The multiplicand control 48 sets the rate at which the word values can be increased or decreased by delivering to multiplier 49 a number that is to be multiplied by the word in the multiplicand memory 60. If the output is of the correct level, a 1 is delivered. Thus, the content of multiplicand memory 60 is not altered as it is multiplied by unity. If the output is to increase, it delivers a number larger than one. Thus, the multiplicand will increase with each multiplication.

At the 1 millisecond sampling interval, a multiplication will be performed 1,000 times a second for each signal or once every millisecond Thus, if the contents of the multiplicand memory 60 are multiplied by a number larger than one every millisecond, the multiplicand will increase at a constant db. per second rate. The number is selected by the AGC speed switch 63. The number can be any value desired. In one system, the number was 1.0109 for the medium speed. That is, a 94 db. per second rate at the 1 ms. sampling interval. This is approximately a 1 percent step change at a time. This is only a slight ripple at the sampling frequency. A playback filter in unit 21 served to remove this ripple. The number is $(1.0109)^2$ for the fast speed and 1.0109 for the slow speed. The three speeds are 188 db./second, 94 db./second and 47 db./second. Other values can be used. If the sampling interval is 2 ms., these speeds are cut in half. At 4 ms. interval, they are divided by 4. At 8 ms. sampling interval, they are divided by 8.

To decrease the word, the number from the multiplicand control 48 must be less than one. In this system, it is 0.98922 for the medium speed, i.e.:

$$0.98922 = 1/1.0109$$

Thus, the db./second decrease rate will be the same as the increase rate. The number for the fast speed is $(0.98922)^2$ and for the slow speed, it is 0.98922. Thus, increase and decrease rates are equal. They can be made different if desired. The number from the multiplicand control 48 goes to multiplying unit 49. The output to multiplying unit 49 is routed through gating 56 to the multiplicand memory 60. This loop provides the successive multiplications of the multiplicand by a constant number supplied by the multiplicand control 48. The multiplicand in the multiplicand memory 60 is applied as an input to the multiplying unit 35. This multiplies the shift register contents by the multiplicand from memory 60 to provide the normalized output.

This accomplishes the result of digitally performing an AGC operation to keep the output near a normalized value.

The overall operation is restated. The data is entered into a shift register 31. The exponent or gain word determines the number of shifts performed. The contents of the shift register 31 are now at the original signal level. The output of the shift register 31 is multiplied by a multiplicand to give the normalized output. The initial multiplicand is set in manually.

The normalized output goes to a peak detector subsystem 40—42. This detects the peaks of the signal and stores them in a peak memory 43. The word in the peak memory 43 is examined. If it exceeds an upper set point, a decrease command is given to the multiplicand control 48. If it is below a lower set point, an increase command is given.

In the absence of an increase or decrease command, the multiplicand control 48 delivers a one to a multiplying unit 49. For decrease command, it delivers a number less than one. For an increase command, it delivers a number greater than one. The value of these numbers is set by the AGC speed control switch 63.

The number delivered by the multiplicand control 48 is multiplied by the multiplicand memory 60 in multiplier 49. The product is gated to the multiplicand memory 60. This stores the new multiplicand in the memory.

The multiplicand in multiplicand memory 60 is multiplied in multiplier 35 by the shift register contents in shift register 31 to give the normalized output.

Figure 3:
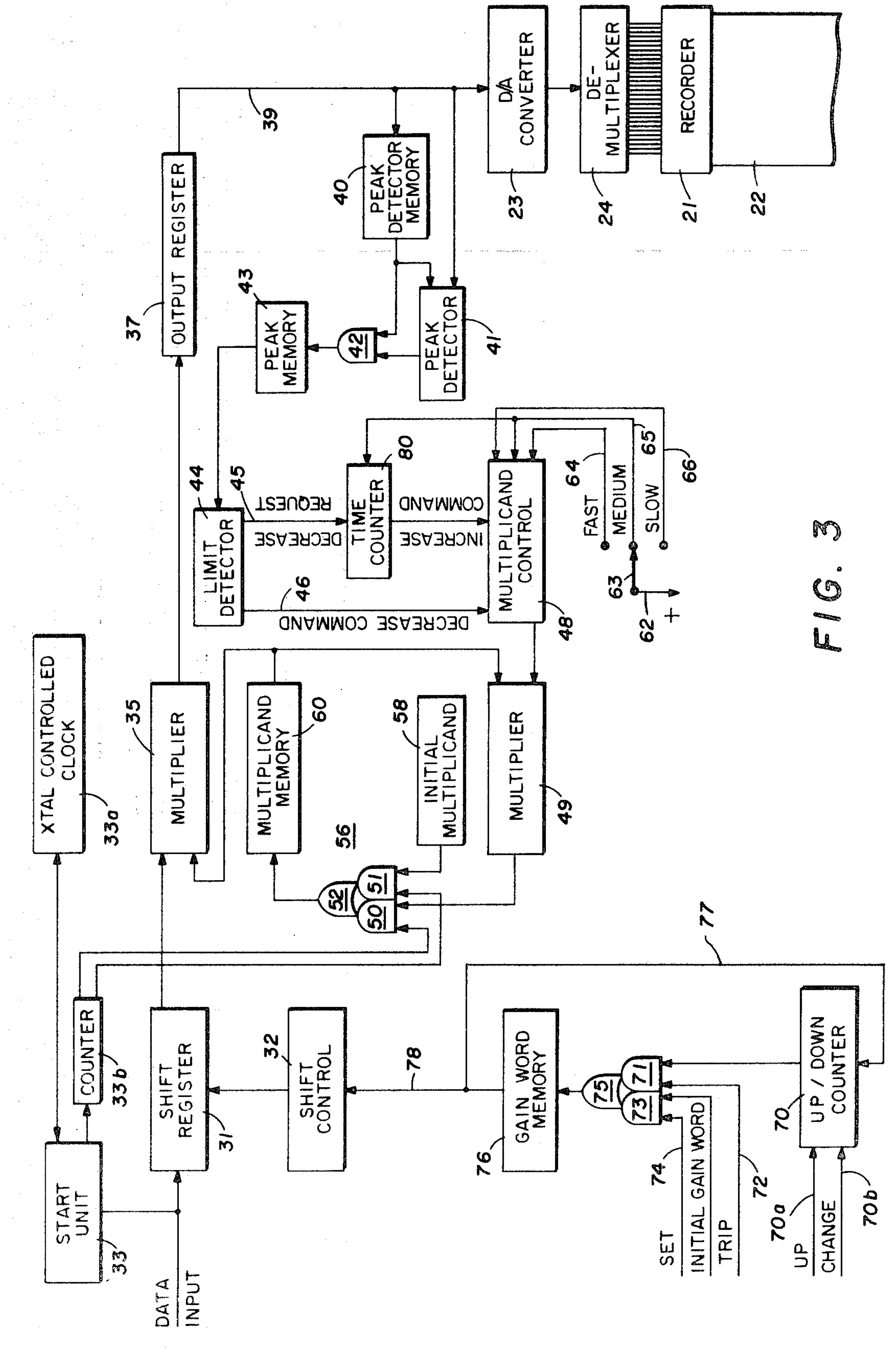
FIG. 3 illustrates an embodiment of the invention wherein changes in gain are indicated by two digits recorded along with each signal word.

The system of FIG. 3 differs from that of FIG. 1 in two major respects. The first difference involves means to accommodate gain changes indicated at the input by only one or two digits, rather than by gain word, to indicate an increase or decrease in gain during the recording operation. This involves the application of the gain change indication to a counter 70 whose output is connected to an AND gate 71, the second input of which is supplied by way of the TRIP line 72. An initial gain word is applied to AND gate 73 along with a signal on a SET line 74. The outputs of the gates 71 and 73 are applied to an OR gate 75 which actuates a gain word memory 76. The output of the gain word memory is then applied by way of channel 77 to the counter 70 and by way of channel 78 to the shift control unit 32. Thus, the gain word is reconstructed from the gain change bit recorded.

FIG. 3 shows a system which accommodates use of a one to indicate increases on a scan or a zero to indicate gain decreases. One bit is recorded with each data word to indicate a gain change. A zero indicates the gain did not change. In most systems a notation is made of the initial gain word before any data is received. Playback of this initial gain word will serve to start the word at the correct level.

In FIG. 3 the SET line 74 is high at the start of the record. This gates the initial gain word into the gain word memory 76. The initial gain word can come from a playback of the record header or from manual switches if the initial gain word is not recorded for reproduction. The gain word from the memory 76 is entered into UP/DOWN counting register 70. If the UP line is high, the counter 70 is conditioned to count up. If the UP line is zero, the counter 70 is conditioned to count down. A pulse on the change line **70*b* will make one count. The count will be up or down as conditioned by the UP line 70*a*. After the first arrivals, the SET line 74 will go to zero and the TRIP line 72 will be high. This routes the output of counter 70 to the gain word memory 76**. The gain word memory has the latest gain word in storage at all times.

Systems that record one bit for an up change and another for a down change would require a slight modification of the UP/DOWN counter of FIG. 3. The two lines **70*a* and 70*b* would be labeled UP and DOWN, respectively. A pulse on the UP line 70*a* would cause a count up of one count. A pulse on the line 70*b*** would cause it to count down one count.

The UP/DOWN counter 70 may be made in several forms. One would be an UP/DOWN counting register. Another would be a holding register and an adder. An up-count would be accomplished by adding one to the adder. A down-count would be accomplished by adding the two's complement of one.

The second difference of FIG. 3 from FIG. 1 involves the inclusion of a time delay counter 80 in the increase command channel 45. Channel 65 is connected to the time counter 80 as well as to the multiplicand control 48. This prevents the gain control from immediately beginning to increase the gain while retaining the capability of the system immediately to decrease the gain if the amplitude approaches a point at which the converter would be overdriven.

Ordinarily the lower set point will be set in the order of 6 db. below the upper set point under operator control. The time counter 80 can be of two forms. One would contain a counting register and a count memory. The other would contain a holding register, an adder, and a count memory.

The operation consists of loading such count memory contents into the counting register. An increase request will cause the counting register to advance one number. This can also be accomplished by adding one to the least significant bit of the adder in the second type of counter. In the absence of an increase request, the register is reset to zero. The new count, either all zeros or one larger than the previous count, is entered into the memory. When the count reaches a set number, an increase command is sent to the multiplicand control. The function of the time counter 80 is to require that the peak be below the lower set point for a given interval of time before an increase command is given.

The invention has the advantage that the memories required are quite small. All memories must store one word for each data channel. Thus, most seismic data systems would not require more than 32 words in each memory. Very few systems would require more than 64 words. Fifteen bits per word would be adequate for all of the memories. The memory associated with the time counter 80, FIG. 3, would not need more than seven bits per word. These memories can be of several forms.

Except for the foregoing differences, the systems of FIG. 1 and 3 are the same and for this reason the same reference characters have been employed therein except as above noted.

In FIG. 1 the clock 33*a* provides control pulses to the various units in the system as required.

Figures 2, 4:
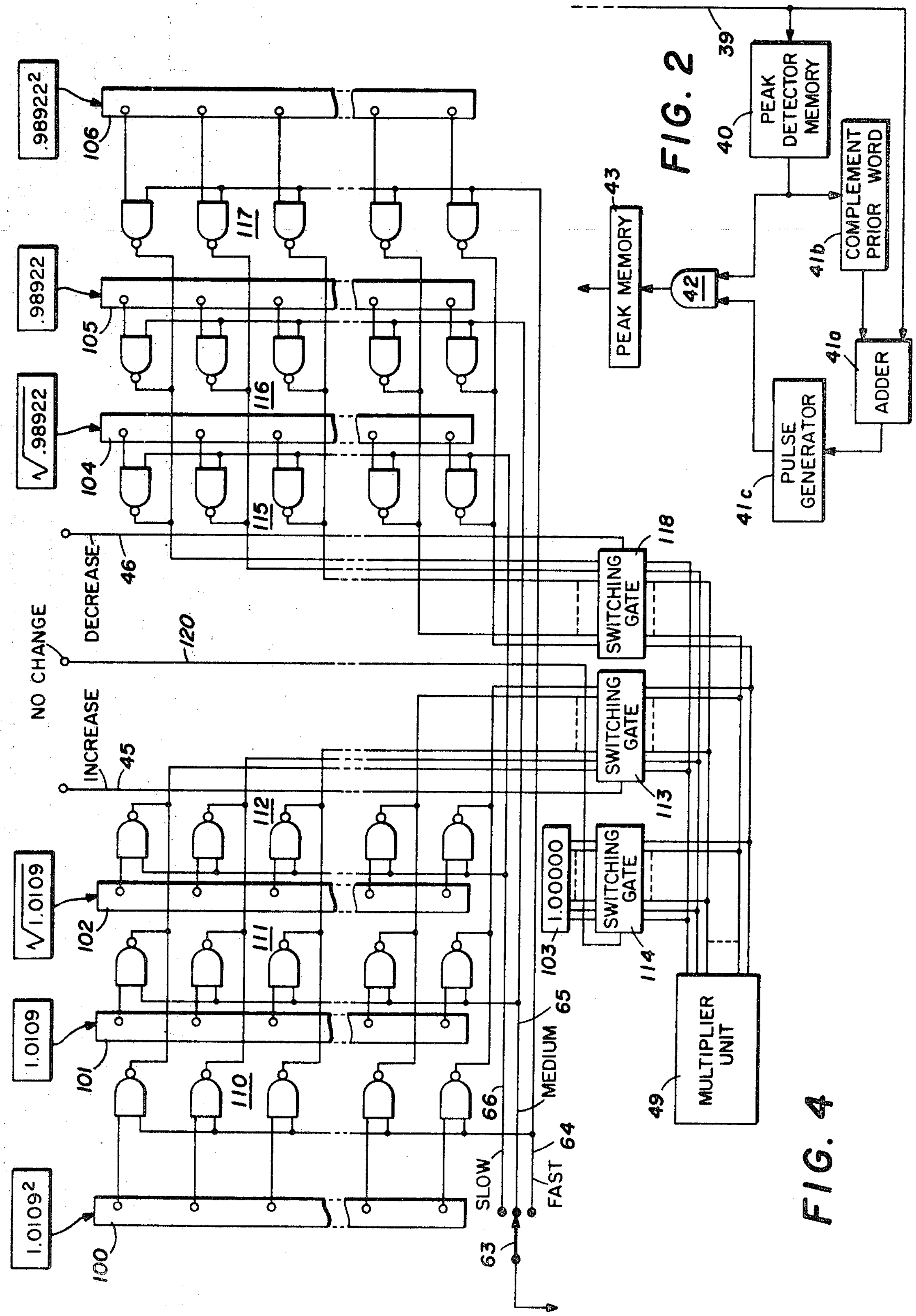
FIG. 2 illustrates a peak detector.
FIG. 4 illustrates one form of a multiplicand control unit.

FIG. 4 illustrates one form of network for the multiplicand control unit 48 of FIGS. 1 and 3. In this system, seven preset registers 100—106 are provided. The registers are preset to have the desired gain change rate multipliers therein. In the embodiment discussed above, the change rate multipliers in registers 100—106 were $1.0109^2$, 1.0109, 1.0109, 1.00000, .98922, .98922, and $.98922^2$, respectively. Registers 100-—102 are provided with gates 110, 111 and 112, respectively, leading to a switching gate 113. The output of the switching gate leads to the multiplier unit 49. The register 103 is coupled by way of a switching gate 114 to multiplier unit 49. Registers 104—106 are coupled by way of gates 115—117, respectively, to a switching gate 118, the output of which leads to the multiplier unit 49.

The gates 110 and 117 are enabled by a high state on the FAST bus 64 leading from the switch 63. Gates 111 and 116 are enabled by a suitable state on the MEDIUM speed bus 65. The gates 112 and 115 are enabled by the proper state on the SLOW bus 66.

The increase channel 45 is connected so as to enable the switching gate 113. The decrease channel 46 is connected so as to enable the switching gate 118. If no change is to be made, then the proper state on line 120 enables the switching gate 114. By this means, the direction of the desired gain change is controlled by energization of one or the other of gates 113, 114 or 118. The rate at which the gain changes is controlled by the state on one of the lines 64, 65 or 66.

While the invention has been described with reference to a particular system, it will be appreciated that the invention is not limited to such system but that various changes may be made without departing from the spirit or scope of the invention. The sampling interval, the number of channels and the specific construction of the various elements in the system as well as other features may be changed while utilizing the digital gain control operation set forth in the appended claims, and it is intended to cover such modifications as fall within the scope of such claims.

I claim:

1. The method of automatic gain control of seismic signals formed of digital words having gain changes stepped in accordance with a factor of $2^n$ and wherein a digitally coded signal is time related to the seismic signal, which comprises the steps of:

a. shifting each word of said seismic signal in accordance with said gain signal to restore said seismic signal to its true amplitude;
b. multiplying each true amplitude signal by a gain control multiplicand in a digital multiplier channel;
c. comparing said true amplitude output from said multiplier channel with predetermined upper and lower limits and varying said multiplicand applied to said multiplier channel until the output therefrom is within said predetermined limits; and
d. converting to analogue signals the digital word output from said multiplier channel.

2. An AGC system for use in restoration of seismic signals formed of digital words having gain changes stepped in accordance with a factor $2^n$ and wherein a digitally coded gain signal is related on a time scale to the seismic signal, comprising:

a. a multiplier channel which produces a multiplier channel output that includes;
 a shift register for receiving successive words of said seismic signals; and
 an output register for receiving the output of said multiplier channel;
b. a shift control means responsive to said gain signal for shifting the radix point in each word in said shift register in accordance with said gain signal;
c. multiplicand means having an input and output;
d. said multiplier channel having as inputs the output from said shift control means and the output from said multiplicand means; and
e. comparison means responsive to said multiplier channel output for comparing said output to predetermined upper and lower limits to vary the output of said multiplicand means thereby to produce a multiplier channel output within said predetermined limits.

3. A combination set forth in claim 2 in which a plurality of related seismic signals are treated and wherein storage means are provided at the output of said multiplier channel of such capacity to store one word for each of said signals and wherein said multiplicand means is of like capacity.

4. The combination set forth in claim 2 in which said comparison means includes a time delay to produce a gain increase command only after said multiplier channel output has been below the lower limit for a predetermined time.

5. The combination set forth in claim 2 in which said multiplying channel is a primary unit and the output of said multiplicand means is also connected to the input of a secondary multiplying unit with the output of said secondary multiplying unit being applied to the input of said multiplicand means and in which means are provided for producing a multiplicand for said secondary unit which is unity, slightly greater or slightly less than unity depending upon whether the output from said multiplier channel is within preset limits, is less than a preset limit or is greater than a preset limit, respectively.

6. The combination set forth in claim 2 wherein a detector unit is connected to said multiplier channel output and wherein a limit detector is connected to the output of said detector unit for control of the change in said multiplicand means.

7. The combination set forth in claim 2 wherein a D-A converter followed by a demultiplexer is connected to said multiplier channel.

8. The combination set forth in claim 2 in which the last-named means includes a peak detector memory connected to the output from said multiplier channel:

a peak detector connected at its first input to the output from said multiplier channel and at its second input to the output from said peak detector memory;
a peak memory connected to the output of said peak detector memory and said peak detector for storing successive peak values;
a limit detector connected to said peak memory and having preset amplitude limits;
a multiplicand control having stored therein at least one multiplicand greater than unity and one multiplicand less than unity;
means for connecting said limit detector to said multiplicand control to select the multiplicand greater than unity or less than unity when the signal from said peak memory is less than or exceeds the preset limits is said limit detector respectively;
a secondary multiplying unit connected at one input to said multiplicand control; and
said multiplicand means connected at its output in said first-named multiplier channel and to the second input to said secondary multiplying unit and means for applying the output of said secondary multiplying unit to said multiplicand means.

9. The combination set forth in claim 2 wherein means are provided for receiving and employing a new gain control word as said coded gain signal with each of said successive words.

10. The combination set forth in claim 2 wherein means are provided for modifying a gain control word in response to a bit received with each of said successive words to form said coded gain control signal.